(12) United States Patent
Ference et al.

(10) Patent No.: US 6,534,389 B1
(45) Date of Patent: Mar. 18, 2003

(54) DUAL LEVEL CONTACTS AND METHOD FOR FORMING

(75) Inventors: Thomas G. Ference, Essex Junction, VT (US); Kurt R. Kimmel, Jericho, VT (US); Alain Loiseau, Williston, VT (US); Jed H. Rankin, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/521,977

(22) Filed: Mar. 9, 2000

(51) Int. Cl.$^7$ .................. H01L 21/3205; H01L 21/4763
(52) U.S. Cl. ...................... 438/586; 438/622; 438/624; 438/633; 438/637; 438/638
(58) Field of Search .................. 438/585, 586, 438/588, 622, 624, 633, 637, 638, 639, 626

(56) References Cited

U.S. PATENT DOCUMENTS

| | | | |
|---|---|---|---|
| 4,851,361 A | 7/1989 | Schumann et al. ......... 438/201 |
| 5,115,296 A | 5/1992 | Hsue et al. ................. 257/344 |
| 5,362,666 A | * 11/1994 | Dennison .................... 438/396 |
| 5,401,691 A | * 3/1995 | Caldwell .................... 438/633 |
| 5,466,636 A | * 11/1995 | Cronin et al. ............... 438/392 |
| 5,554,557 A | 9/1996 | Koh ........................... 438/396 |
| 5,578,524 A | * 11/1996 | Fukase et al. .............. 438/624 |
| 5,677,557 A | 10/1997 | Wuu et al. .................. 257/382 |
| 5,710,073 A | 1/1998 | Jeng et al. .................. 438/239 |
| 5,718,800 A | 2/1998 | Juengling ................... 438/200 |
| 5,792,703 A | 8/1998 | Bronner et al. ............. 438/620 |
| 5,817,562 A | 10/1998 | Chang et al. ............... 438/305 |
| 5,831,899 A | 11/1998 | Wang et al. ................ 365/156 |
| 5,849,622 A | 12/1998 | Hause et al. ............... 438/286 |
| 5,858,837 A | 1/1999 | Sakoh et al. ............... 438/255 |
| 5,895,948 A | 4/1999 | Mori et al. ................. 257/306 |
| 5,895,961 A | 4/1999 | Chen .......................... 257/382 |
| 5,899,722 A | 5/1999 | Huang ........................ 438/305 |
| 5,899,742 A | 5/1999 | Sun ............................ 438/682 |
| 5,907,781 A | * 5/1999 | Chen et al. ................. 438/303 |
| 6,004,853 A | * 12/1999 | Yang et al. ................. 438/305 |
| 6,074,912 A | * 6/2000 | Lin et al. ................... 438/253 |
| 6,121,129 A | * 9/2000 | Greco et al. ............... 438/622 |
| 6,159,844 A | * 12/2000 | Bothra ....................... 438/637 |
| 6,174,803 B1 | * 1/2001 | Harvey ....................... 438/638 |
| 6,223,432 B1 | * 5/2001 | Dennison et al. .......... 438/622 |
| 6,287,951 B1 | * 9/2001 | Lucas et al. ................ 438/618 |
| 6,291,335 B1 | * 9/2001 | Schnabel et al. ........... 438/626 |
| 6,319,813 B1 | * 11/2001 | Givens ....................... 438/624 |

* cited by examiner

Primary Examiner—Carl Whitehead, Jr.
Assistant Examiner—Toniae M. Thomas
(74) Attorney, Agent, or Firm—Schmeiser, Olsen & Watts; William D. Sabo

(57) ABSTRACT

A method for making electrical contacts to device regions in a semiconductor substrate, and the resulting structure, is presented. A first set of borderless contacts is initially formed. This first set of contacts is then contacted by a second series of smaller, upper-level contacts. The second set of contacts also contact the gate of the device. The structure which results has a form wherein there are stacked contacts to the diffusion layer, and a single level contact to the device gate. The structure further provides local interconnectability over gate structures.

6 Claims, 5 Drawing Sheets

DUAL LEVEL CONTACTS AND METHOD FOR FORMING

BACKGROUND OF THE INVENTION

1. Technical Field

The present invention relates to silicon device manufacturing and in particular to an improved method for forming contact wiring to substrate devices.

2. Related Art

Silicon devices are continually being made smaller with the goals of increasing both device speed and circuit density. The miniaturized devices built within and upon a semiconductor substrate are spaced very closely together and their package density continues to increase significantly. As the package density increases, silicon devices are subject to electrical and physical limitations which stem from their reduced size.

One type of silicon device experiencing such electrical limitations is the array of storage cells on a static random access memory (SPAM) chip. Individual SRAM storage cells typically consist of a single metal oxide semiconductor field effect transistor (MOSFET) and a single capacitor. These cells are used throughout the electronic industry for storing a single bit of data as an electrical signal.

In metal oxide semiconductor (MOS) devices, polysilicon film has been the form of metallization used for gates and also for connecting to MOS devices. The inability of further miniaturization of the contact metallization and the first level connections (i.e., MOS on the substrate) is a major obstacle in the miniaturization of SRAMs and other devices, such as MOS and bipolar devices. Typically, cell capacitors are formed with a sidewall spacer surrounding a portion of a polysilicon layer. As cell density increases, the thickness of this sidewall spacer and other features is necessarily decreased, creating an obstacle to increasing circuit density in SRAMs. In particular, pulldown at the top of the sidewall spacer causes electrical shorting of the diffusion contact to the gate during salicidation, rendering the device inoperable. Thus, the problems encountered when forming smaller first level contacts and first level interconnections, and the problems of decreased feature size must be resolved to enable further increases in circuit density in semiconductor devices.

Utilization of self-aligned contacts is useful in semiconductor fabrication because they reduce the difficulties associated with precise alignment, thus allowing a considerable shrinkage in device size. Borderless contacts are contacts that are placed on the contact mounting surfaces of the substrate, and which may overlap adjacent features within the device, for example, sidewall spacers and gate conductors, without producing an electrical short circuit. The utilization of borderless contacts provides several advantages in semiconductor device manufacturing. First, borderless contacts enable production of a device having contact mounting surfaces that are smaller than the contacts placed upon them. Second, borderless contacts allow for compensation of manufacturing tolerances. Finally, the risk of electrical short circuits between device elements is eliminated.

Many of the related art methods require substantially more processing steps and/or planar structures which make the manufacturing process more complex and costly. Also, other processing methods rely on etching to a predetermined etch depth which can be quite difficult to control in a manufacturing environment. Therefore, it is desirable to develop processes that are as simple as possible to implement, and also provide methods that do not require etches without distinct stopping layers.

SUMMARY OF THE INVENTION

The present invention is directed to a method of forming diffusion and gate contacts, by forming a borderless diffusion contact adjacent to a first capped gate electrode followed by forming contacts to the borderless contact and to a second non-capped gate electrode.

The invention is further directed to a method of forming a contact structure on a semiconductor substrate having a plurality of electronic elements thereon, including capped gate electrodes and uncapped gate electrodes of field effect transistors, the contact structure establishing an electrical connection between selected ones of said electronic elements and an interconnecting conductive layer, comprising the steps of:

forming a lower planarized insulator structure on the substrate;

forming a plurality of borderless conductive vias in said lower planarized insulator structure, said borderless vias partially overlaying the capped gate electrodes;

forming an upper planarized insulator structure on said lower planarized insulator structure; and forming an upper planarized insulator structure on said lower planarized insulator structure; and forming a second plurality of conductive vias in said upper planarized insulator structure, at least some of said second plurality of conductive vias contacting said borderless vias, and at least some others of said second plurality of conductive vias comprising bordered vias to the uncapped gate electrodes on the substrate.

The invention is further directed to a contact structure on a semiconductor substrate having a plurality of electronic elements thereon, including capped gate electrodes and uncapped gate electrodes of field effect transistors, the contact structure establishing an electrical connection between selected ones of said electronic elements and an interconnecting conductive layer, comprising:

a lower planarized insulator structure on the substrate;

a plurality of borderless conductive vias in said lower planarized insulator structure, said borderless vias partially overlaying the capped gate electrodes;

an upper planarized insulator structure on said lower planarized insulator structure; and a second plurality of conductive vias in said upper planarized insulator structure, at least some of said second plurality of conductive vias contacting said borderless vias, and at least some others of said second plurality of conductive vias comprising bordered vias to the uncapped gate electrodes on the substrate.

It is a further advantage to provide a semiconductor device having substantially coplanar contact mounting surfaces, comprising:

a substrate having at least one diffusion region and at least one gate stack;

three distinct stacked insulative layers, namely inner, middle, and outer, deposited upon the substrate;

contacts formed within the three insulative layers which provide connection to the diffusion region;

contacts formed within the three insulative layers which provide connection to the gate stack; and wherein the contacts within the middle insulative layer have a cross-sectional area smaller than that of the contacts within the outer insulative layer.

The foregoing and other objects, features and advantages of the invention will be apparent in the following and more particular description of the preferred embodiments of the invention as illustrated in the accompanying drawings.

BRIEF DESCRIPTION OF THE DRAWINGS

The preferred embodiments of this invention will be described in detail, with reference to the following figures, wherein like designations denote like elements, and wherein.

DETAILED DESCRIPTION OF THE INVENTION

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangements thereof, etc., and are disclosed simply as an example of the preferred embodiment. Although the drawings are intended to illustrate the present invention, the drawings are not necessarily drawn to scale.

Figure 1:
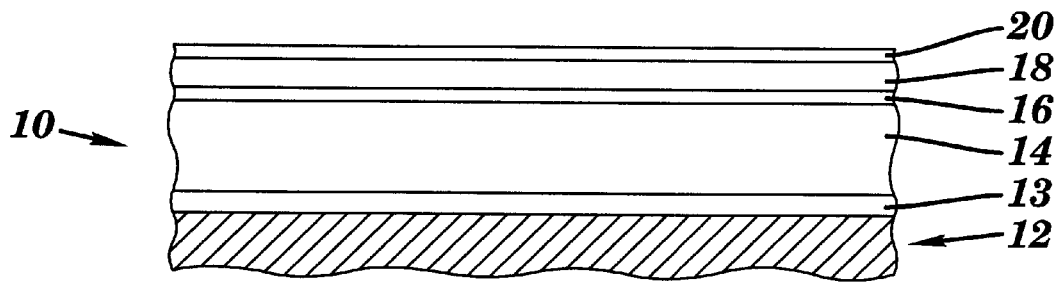
FIG. 1 depicts a front cross-sectional view of a layered semiconductor structure, ab initio, in accordance with a preferred embodiment of the present invention.

Referring to the drawings, FIG. 1 shows the initial step in the fabrication method. FIG. 1 illustrates a front cross-sectional view of a layered semiconductor structure 10 at the initial point in the process disclosed herein, in accordance with preferred embodiments of the present invention. A semiconductor substrate 12 provides the foundation for the remaining process steps. The semiconductor substrate 12 includes a semiconductor material such as silicon.

The substrate 12 is covered by an electrically insulative dielectric layer 13, a conductive polysilicon layer 14 aligned on the dielectric layer 13, and an insulative layer 16. These layers are sequentially deposited upon the semiconductor substrate 12. In the preferred embodiment of the invention, the polysilicon layer 14 is covered by a first TEOS (tetraethylorthosilicate) layer 16, a silicon nitride layer 18, and a second TEOS layer 20. The second TEOS layer 20 protects the nitride layer 18 during subsequent processing. Conventional methods are used to form layers 14, 16, 18, and 20.

Figure 2:
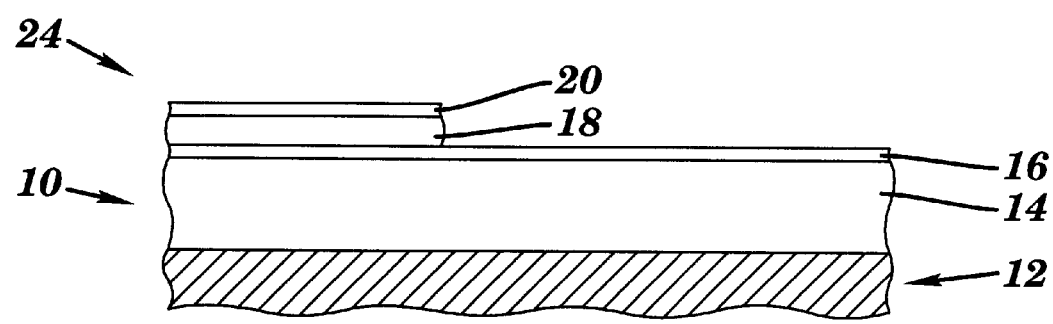
FIG. 2 depicts FIG. 1 after application of a masking layer and an etch of the oxide and nitride layers.

Referring now to FIG. 2, the structure 10 is depicted following application of a nitride protect (NP) photoresist mask (not shown) and subsequent removal of a portion of the nitride layer 18 and second TEOS layer 20. The NP mask is applied to the structure 10, and conventional etching techniques are employed, in order to leave the TEOS/silicon nitride/TEOS layers 16, 18, 20, respectively, remaining only in selected areas.

Figure 3:
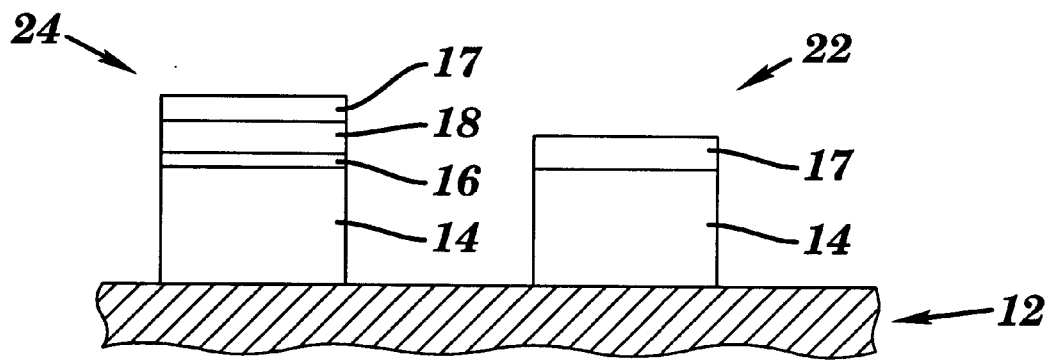
FIG. 3 depicts FIG. 2 after formation of a gate electrode using a polysilicon conductor mask and an etch.

FIG. 3 shows the result of defining a first stack 22 (which will subsequently be formed into a gate stack structure) and a second stack 24 (which will subsequently be formed into a capped gate stack structure). The definition of these stacks 22, 24 is typically accomplished through application of a polysilicon conductor (PC) photoresist mask (not shown) and corresponding etching step(s). The gate stack structure 22 is defined by selective removal of material down to the polysilicon layer 14, using photolithographic and etching techniques known and used in the art. Material surrounding the gate stack structure 22 is further removed down to the substrate 12, thereby leaving the gate stack structure 22.

The capped gate stack structure 24 is defined by selective removal of material down to the polysilicon layer 14, typically during the same process step as that forming the gate stack oxide layer 17. Similarly, material surrounding the capped gate stack structure 24 and the gate oxide layer 17 is also removed down to the substrate 12, leaving the capped gate stack structure 24 isolated. The silicon nitride layer 18 performs several functions. First, since it is composed of an electrically insulative material, it serves as an insulative cap to prevent electrical shorting between the capped gate stack structure 24 and borderless diffusion contact 34 formed subsequently and shown in FIG. 6. The silicon nitride layer 18 also functions as an etch stop in the etching steps to be described below.

Figure 4A:
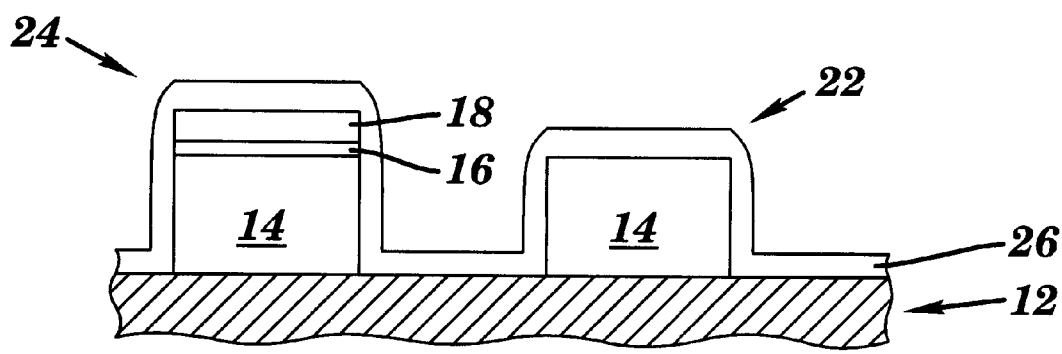
FIGS. 4A and 4B depict FIG. 3 following formation of insulative sidewall spacers abutting the gate and diffusion structures.
Figure 4B:
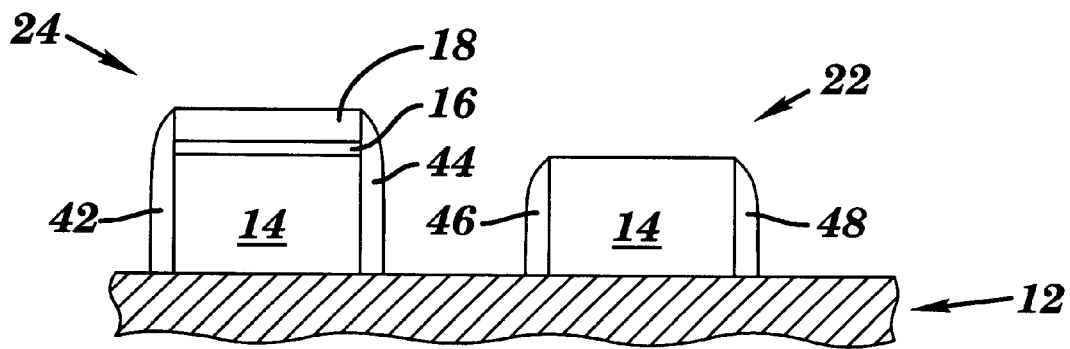

In a method shown in FIGS. 4A and 4B, a layer of conformal film of silicon nitride 26 is deposited over the entire surface o substrate 12 including the capped gate stack structure stack 24 and the gate stack 22. A Reactive Ion Etching (RIE) process is then performed to remove unwanted portions of the conformal film 26 leaving the insulative sidewall spacers 42, 44, 46, 48.

Figure 5:
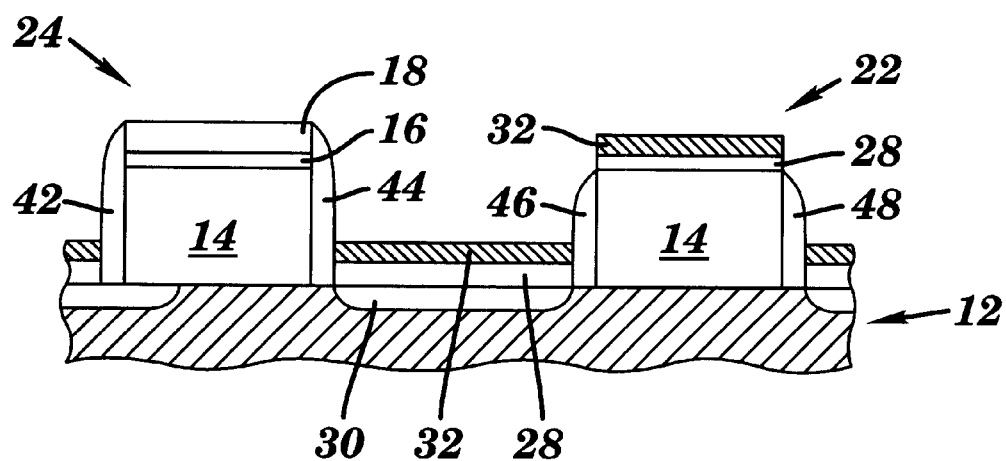
FIG. 5 depicts formation of a silicide in accordance with a preferred embodiment of the present invention.

Referring to FIG. 5, a source/drain region 30 has been formed in the substrate 12 of FIG. 4B. The source/drain region 30 is formed by an ion implantation technique or other method known to one of ordinary skill in the art. Next, a silicide-forming metal layer 28, preferably titanium, or in the alternative cobalt, is selectively deposited over the surface of gate structure 22 and the source/drain region 30. The structure is then annealed using conventional processes. During the annealing process, the silicide-forming metal layer 28 is chemically transformed into a silicide layer 28. It should be noted that the layer of silicide-forming metal 28 will not form a silicide on an insulative material, such as the sidewall spacers 42, 44, 46, 48 or the nitride layer 18. The substrate 12 may then placed in a bath of hydrofluoric acid to remove that portion of the layer that did not form the silicide layer 28, namely, in the regions still covered by the insulative nitride layer 18 and the sidewall spacers 42, 44, 46, 48 that are not covered by the conductive layer 32.

Figure 6:
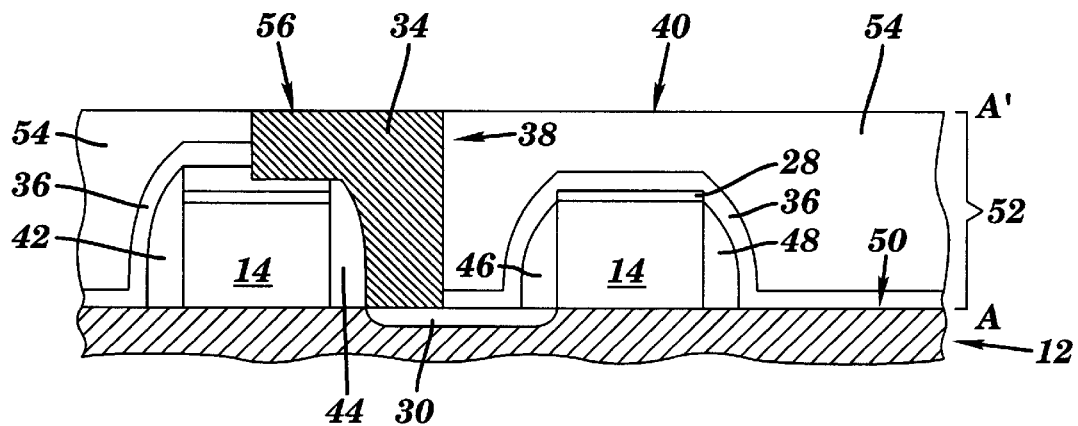
FIG. 6 depicts deposition of a barrier nitride, definition of a first contact level to form a borderless diffusion contact and a first metal interconnect layer, and an insulative fill and deposition of a second interlayer dielectric (ILD) in accordance with a preferred embodiment of the present invention.

FIG. 6 illustrates a cross-sectional view of the substrate 12 following deposition of a conformal blanket nitride barrier 36, and a layer of insulative material 54, such as phosphosilicate glass (PSG) or borophosphosilicate glass (BPSG), using techniques known in the art. The insulative material 54 is then polished. Additionally, a portion of both the layer of insulative material 54 and the nitride barrier 36 is removed using a CA (Contact A) photomask and an RIE etch-back process, in order to form a cavity 38 in the nitride barrier 36. The cavity 38 is subsequently filled with a metal fill using a process such as a chemical vapor deposition (CVD) of a contact liner (e.g., Ti an d TiN), followed by a layer of tungsten (W), and a polishing step. This results in a borderless diffusion source/drain contact 34. The upper surface 40 of the borderless diffusion source/drain contact 34 and the upper surface 50 of the substrate 12, when taken together, and after planarization, define a first contact level (CA) 52 extending from A to A' in FIG. 6. The metal fill is typically tungsten. The uppermost surface 40 of the first contact level 52 is then planarized using a CMP process.

Figure 7:
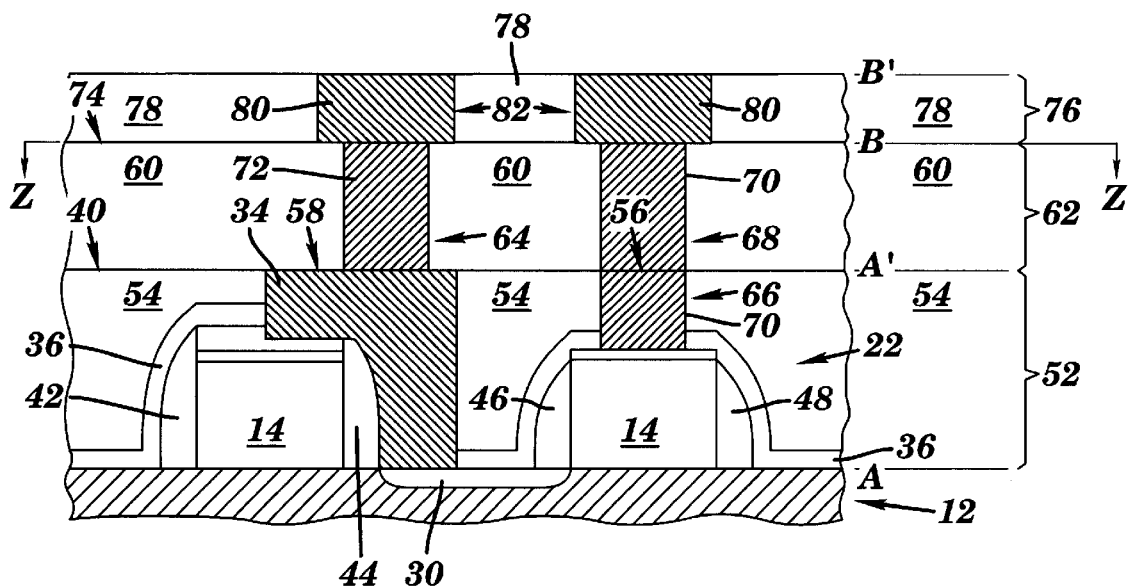
FIG. 7 depicts definition of a second contact level to form an upper portion of a borderless diffusion contact and a gate contact, deposition of a contact liner and contact fill, and definition of a first metal interconnect layer and fill in accordance with a preferred embodiment of the present invention.

FIG. 6 illustrates the borderless contact feature incorporated in the invention. Briefly, the first level contact 34 may overlap adjacent features upon a substrate, (here, the diffusion stack 24) without inducing an electrical short circuit. As shown in FIG. 7, this allows production of devices wherein the contact surface B of contact level 62 may have a smaller pitch (via spacing, from the midpoint of one filled via to the next)than the contact surface A of contact level 52. There is also the advantage that this method inherently compensates for contact-to-contact alignment errors during manufacturing.

Referring to FIG. 7, a pair of completed dual level contacts are shown. A second insulative layer 60 is deposited on the planarized first interconnection layer 52. This second insulative layer 60 will form the second interconnection layer 62 that extends between A' and B in FIG. 7. A cavity 64 is then opened in the second insulative layer 60 above the borderless diffusion source/drain contact 34, using techniques known in the art. Using these techniques, a second cavity 68 is also opened in the second insulative layer 60 above the gate stack 22. However, this second cavity 68 also extends downwards, as cavity 66, through layer 54, to the top of the gate stack 22. The cavities 64, 66, 68 are subsequently filled with a metal fill resulting in two distinct types of contacts. These are a stacked source/drain diffusion contact 34, 72 to the diffusion area, and a single level contact 70 to the gate. The upper surface 40 of the borderless diffusion source/drain contact 34 and the upper surface 74 of the second insulative layer 60, when taken together, define a second interconnection level (CB) 62 extending from A' to B in FIG. 7. The metal fill is typically tungsten. The uppermost surface 74 of the second interconnection layer 62 is then planarized using a CMP process.

A third insulative layer 78 is deposited upon the planarized second interconnection layer 62. Using known etching techniques, two cavities 82 are opened in the third insulative layer 78. The cavities 82 are subsequently filled with a metal fill 80, typically tungsten, to complete the first metal wiring level. Finally, planarization is performed to provide a level finished surface.

Figure 8:
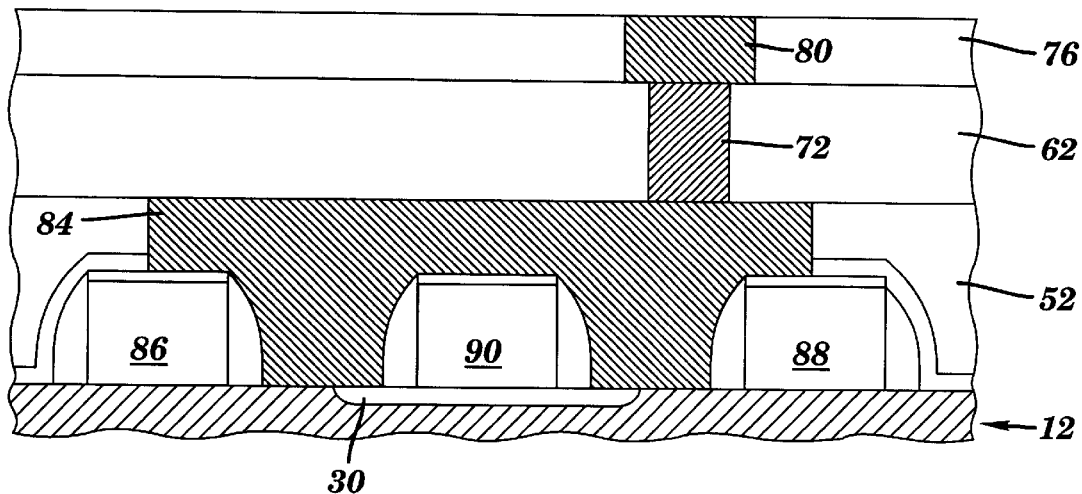
FIG. 8 depicts a structure wherein the bottom metal contact functions as a local interconnect layer to connect two devices over another gate in accordance with a preferred embodiment of the present invention.

FIG. 8 depicts an alternative embodiment of the present invention wherein a bottom metal contact 84 functions as a local interconnect layer to connect first and second devices 86, 88 over a gate 90. This type of device is an interconnect device which can be used in any applications where you need to connect features in a local vicinity.

Figure 9:
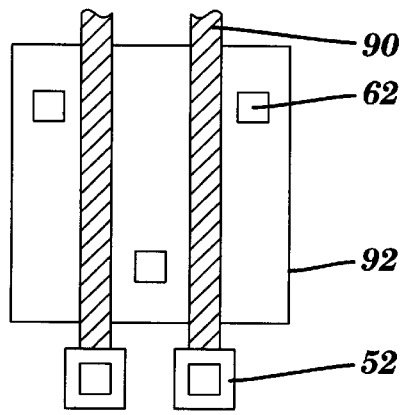
FIG. 9 depicts a plan view of a semiconductor device having a related art structure and a relatively large active area width.
Figure 11:
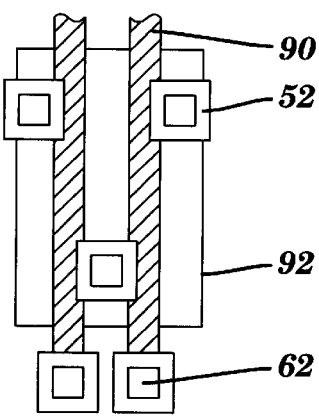
FIG. 11 depicts a plan view of a semiconductor device having a relatively small active substrate width in accordance with a preferred embodiment of the present invention.
Figure 10:
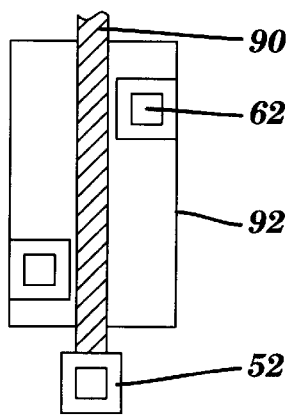
FIG. 10 depicts a plan view of a semiconductor device having a related art structure and a relatively large active substrate width.
Figure 12:
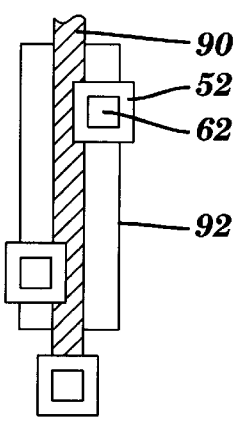
FIG. 12 depicts a plan view of a semiconductor device having a relatively small active substrate width in accordance with a preferred embodiment of the present invention.

As can be seen in a comparison of FIGS. 9 and 11 with FIGS. 10 and 12, respectively, the dual level contacts permit increased device density because the second series of smaller, upper level contacts 70, 72, i.e., those in the second contact level 60 (FIG. 7), require less semiconductor chip "real estate" than do conventional contacts. The active diffusion 92 width, of the related art contact schemes, is shown in the plan views of conventional devices of FIGS. 9 and 10. In FIG. 9, for example, the width of the active substrate 92 is 1.74 $\mu$m (microns); in FIG. 10 it is 1.56 $\mu$m. These numbers are compared, respectively, to those of 92 shown in FIG. 11, 1.04 $\mu$m; and FIG. 12, 0.98 $\mu$m. FIGS. 11 and 12 depict a plan view a semiconductor device, and which illustrates the SRAMatic reduction in the active substrate 92 width required to implement the dual contact scheme of the present invention. Thus, an increase in circuit density can be realized with the use of these dual level contacts 34, 72 and 70 (FIG. 7).

While preferred and particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

We claim:

1. A method of fabricating a semiconductor device, comprising the steps of:
   defining a gate stack and a diffusion stack on a substrate;
   forming insulative sidewall spacers abutting the gate stack and the diffusion stack;
   forming a source/drain region in the substrate;
   depositing a conformal nitride barrier over the gate stack and the diffusion stack;
   depositing a first insulative layer over the nitride barrier and first planarizing said first insulative layer;
   after sad first planarizing, forming a first contact, said first contact extending through both the first insulative layer and the nitride barrier to reach the diffusion stack;
   second planarizing said first insulative layer and said first contact;
   after said second planarizing, depositing a second insulative layer upon said first insulative layer and said first contact;
   forming a second contact, said second contact extending through the second insulative layer to the first contact;
   forming a third contact extending through the second insulative layer, the first insulative layer, and the nitride barrier, to the gate stack;
   after forming said second contact and third contact, planarizing said second insulative layer;
   depositing a third insulative layer upon said planarized second insulative layer; and
   forming wiring layers including fourth contacts, said fourth contacts extending from the top of the third insulative layer to the second and third contacts; and
   wherein an area which will contain the gate stack and an area which will contain the diffusion stack each contain a hard-mask consisting of an oxide-nitride-oxide laminar structure.

2. The method of claim 1, wherein chemical mechanical polishing is used for said first planarizing and said second planarizing.

3. The method of claim 1, wherein said first contact and said second contact are comprised of tungsten.

4. The method of claim 1, wherein said first contact and said second contact are comprised of polysilicon.

5. The method of claim 1, further comprising:
   said first contact having a first cross-sectional area;
   said second contact having a second cross-sectional area; and
   wherein the cross-sectional area of said second contact is smaller than the cross-sectional area of said first contact.

6. The method of claim 1, wherein the first contact above the diffusion stack is a self-aligned contact.

* * * * *